(12) United States Patent
Petuhov et al.

(10) Patent No.: US 7,702,115 B2
(45) Date of Patent: *Apr. 20, 2010

(54) METHOD AND APPARATUS TO RECONSTRUCT HIGH-FREQUENCY COMPONENTS OF AN AUDIO SIGNAL

(75) Inventors: Andrey Sergeevich Petuhov, Moscow (RU); Vladimir Aleksandrovich Sviridenko, Moscow (RU); Tatiana Mikhailivna Yudina, Zelenograd (RU); Seung-hun Jeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 945 days.

This patent is subject to a terminal disclaimer.

(21) Appl. No.: 11/326,451

(22) Filed: Jan. 6, 2006

(65) Prior Publication Data

US 2006/0115098 A1 Jun. 1, 2006

(51) Int. Cl.
*H03G 3/00* (2006.01)
*H03G 5/00* (2006.01)

(52) U.S. Cl. .......................................... 381/61; 381/98

(58) Field of Classification Search ............. 381/97–98, 381/61, 27, 103; 700/94
See application file for complete search history.

(56) References Cited

U.S. PATENT DOCUMENTS

| | | | |
|---|---|---|---|
| 4,972,489 A * | 11/1990 | Oki et al. | 381/97 |
| 5,754,666 A | 5/1998 | Nakagawa | |
| 5,893,068 A | 4/1999 | Hasegawa | |
| 5,917,917 A * | 6/1999 | Jenkins et al. | 381/63 |
| 6,023,513 A | 2/2000 | Case | |
| 6,335,973 B1 | 1/2002 | Case | |
| 6,711,214 B1 * | 3/2004 | Hershberger | 375/285 |

* cited by examiner

*Primary Examiner*—Vivan Chin
*Assistant Examiner*—George C Monikang
(74) *Attorney, Agent, or Firm*—Stanzione & Kim, LLP

(57) ABSTRACT

A method and apparatus to reconstruct high-frequency components of an input audio signal. The apparatus includes a frequency inverter to invert the frequency spectrum of the input audio signal, a band pass filter which filters out the higher frequency components of the input audio signal, a converter which shifts the frequency spectrum of the filtered signal to create a correction signal, and an adder which adds the correction signal to the input audio signal to obtain a reconstructed audio signal.

15 Claims, 2 Drawing Sheets

METHOD AND APPARATUS TO RECONSTRUCT HIGH-FREQUENCY COMPONENTS OF AN AUDIO SIGNAL

BACKGROUND OF THE INVENTION

1. Field of the Invention

The present general inventive concept relates to multimedia and radio electronics, and more particularly, to a method and apparatus used to perform digital signal processing to improve the quality of audio signals.

2. Description of the Related Art

Various methods and systems have been developed to improve the quality of audio signals to a degree noticeable by an audience by recovering various high-frequency component characteristics that may have been lost during encoding of the audio signals or during the transmission of the audio signals via channels with poor transmission capability.

One conventional method of recovering audio information lost from audio signals is disclosed in Russian Patent No. RU 2,194,361. In this patented method of recovering lost audio information, digital data is divided into a plurality of blocks of digits in which the digits are arranged in a descending order based on a significance of digit position, thus providing a sufficient level of accuracy to reconstruct a block structure.

In another conventional method of recovering audio information lost from audio signals, which is simpler than the method disclosed in Russian Patent No. RU 2,194,361, correction signals are generated by processing low-frequency components of audio signals. U.S. Pat. Nos. 6,335,973 and 6,023,513, for example, disclose this type of method, and particularly, a method of generating high-frequency harmonic components based on low-frequency components of audio signals. Nonlinear transformation is generally used for generating high-frequency harmonic components based on low-frequency components of audio signals.

In addition to the above conventional audio information recovery methods, U.S. Pat. No. 5,754,666 discloses a method of generating high-frequency components of an audio signal using a high-frequency noise generator. In this patented method, noise parameters are chosen through analysis of low-frequency components of audio signals.

Further, U.S. Pat. No. 5,893,068 relates to a method of expanding a range of frequencies of digital audio signals, thereby enabling addition of high-frequency components of the digital audio signals.

However, due to the characteristic of the human sense of hearing in which the higher the frequency of sound, the lower the frequency resolution of the human ears, it is difficult to improve the quality of audio signals to a degree perceivable by an audience, and which is the same quality as corresponding original audio signals, simply by expanding the frequency range of the audio signals or shifting the frequency spectrum of the audio signals.

SUMMARY OF THE INVENTION

The present general inventive concept provides an apparatus and a method to reconstruct high-frequency components of an audio signal, and in which high-frequency components of an input audio signal that are lost during the transmission of the audio signal can be successfully reconstructed, and thus sound quality as high as the original input audio signal can be achieved even when the original input audio signal is transmitted via a channel with a smaller bandwidth than the bandwidth of the original input audio signal.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing a method of reconstructing high-frequency components of an audio signal including generating a high-frequency signal by transforming low-frequency components of an input audio signal into frequency components having a higher frequency, and reconstructing high-frequency components of the input audio signal by adding the high-frequency signal to the input audio signal, where the high-frequency signal is generated by inverting, filtering, and shifting the frequency of the input audio signal.

The foregoing and/or other aspects of the present general inventive concept may be achieved by providing an apparatus to reconstruct high-frequency components of an audio signal including an adder which serves as an output port of the apparatus, where a first input port of the adder is connected to an input port of the apparatus through which an input audio signal is received, a second input port of the adder is connected to an output port of a second adder, a first input port of the second adder is connected to an output port of a first multiplier, and a second input port of the second adder is connected to an output port of a second multiplier, a first input port of the first multiplier is connected to an output port of a first low-pass filter, and a second input port of the first multiplier is connected to an output port of a cosine wave signal generator which generates a cosine wave signal $\cos(\omega t)$, a first input port of the second multiplier is connected to an output port of a second low-pass filter, a second input port of the second multiplier is connected to an output port of a sine wave signal generator which generates a sine wave signal $-\sin(\omega t)$ with a reversed sign, an input port of the first low-pass filter is connected to an output port of a third multiplier, an input port of the second low-pass filter is connected to an output port of a fourth multiplier, first input ports of the third and fourth multipliers are connected to the input port of the apparatus, a second input port of the third multiplier is connected to an output port of the cosine wave signal generator, a second input port of the fourth multiplier is connected to an output port of a second sine wave signal generator which generates a sine wave signal $-\sin(\omega t)$.

The foregoing and/or other aspects of the present general inventive concept may also be achieved by providing a computer readable medium containing executable code to perform a method of reconstructing high-frequency components of an audio signal, the method including transforming low-frequency components of an input audio signal to frequency components having a higher frequency to obtain a high-frequency signal, and reconstructing high-frequency components of the input audio signal by adding the high-frequency signal to the input audio signal, where the high-frequency signal is generated by inverting, filtering, and shifting the frequency of the input audio signal.

The foregoing and/or other aspects of the present general inventive concept may also be achieved by providing a method of reconstructing high-frequency components of an audio signal including inverting a frequency spectrum of an input audio signal to generate an inverted signal having higher frequency components than the input audio signal, filtering the inverted signal to remove a higher frequency portion of the inverted signal having a higher frequency spectrum than the remaining portion of the inverted signal to generate a filtered signal, shifting a frequency spectrum of the filtered signal to generate a correction signal, and adding the correction signal to the input audio signal to obtain a reconstructed audio signal.

The foregoing and/or other aspects of the present general inventive concept may also be achieved by providing an apparatus to reconstruct high-frequency components of an audio signal including an inverter to invert a frequency spectrum of an input audio signal, and to generate an inverted signal having higher frequency components than the input audio signal, a filter to filter the inverted signal to remove a higher frequency portion of the inverted signal having a higher frequency spectrum than the remaining portion of the inverted signal, and to generate a filtered signal, a converter to shift a frequency spectrum of the filtered signal to generate a correction signal, and an adder to add the correction signal to the input audio signal to obtain a reconstructed audio signal.

The foregoing and/or other aspects of the present general inventive concept may also be achieved by providing a computer readable medium containing executable code to perform a method of reconstructing high-frequency components of an audio signal, the method including inverting a frequency spectrum of an input audio signal, and generating an inverted signal having higher frequency components than the input audio signal, filtering the inverted signal to remove a higher frequency portion of the inverted signal having a higher frequency spectrum than the remaining portion of the inverted signal, and to generate a filtered signal, shifting a frequency spectrum of the filtered signal to generate a correction signal, and adding the correction signal to the input audio signal to obtain a reconstructed audio signal.

The foregoing and/or other aspects of the present general inventive concept may also be achieved by providing an apparatus to reconstruct high-frequency components of an audio signal including first through fourth multipliers, the first multiplier to multiply an input signal by a first function to generate a first multiplied signal and the second multiplier to multiply the input signal by a second function different from the first function to generate a second multiplied signal, first and second filters to receive the first and second multiplied signals, respectively, each of which removes at least one frequency component from frequency spectrums of the first and second multiplied signals and outputs first and second filtered signals to the third and fourth multipliers, such that the third multiplier multiplies the first filtered signal by the first function to generate a third multiplied signal and the fourth multiplier multiplies the second filtered signal by a third function different from the first and second functions to generate a fourth multiplied signal, and first and second adders, the first adder to add the third and fourth multiplied functions to obtain a correction signal and to output the correction signal to the second adder which adds the correction signal to the input signal to obtain a reconstructed signal.

The foregoing and/or other aspects of the present general inventive concept may also be achieved by providing a method to reconstruct high-frequency components of an audio signal including multiplying an input signal by a first function to generate a first multiplied signal and multiplying the input signal by a second function different from the first function to generate a second multiplied signal, filtering at least one frequency component from frequency spectrums of the first and second multiplied signals and outputting first and second filtered signals, multiplying the first filtered signal by the first function to generate a third multiplied signal and multiplying the second filtered signal by a third function different from the first and second functions to generate a fourth multiplied signal, and adding the third and fourth multiplied functions to obtain a correction signal and adding the correction signal to the input signal to obtain a reconstructed signal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
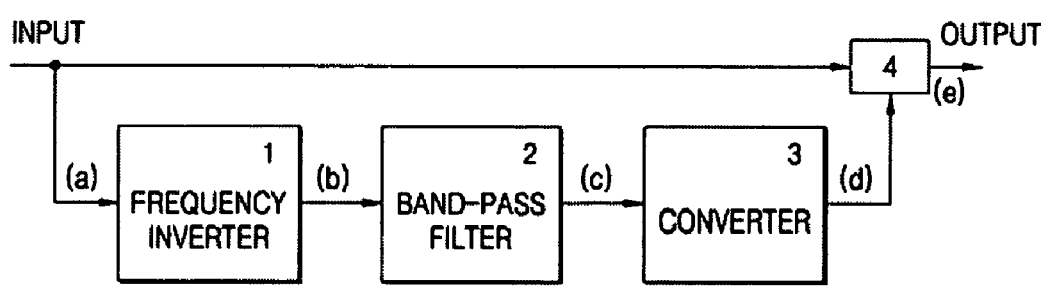
FIG. 1A illustrates a block diagram of an apparatus illustrating the reconstruction of high-frequency components of an audio signal according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In the present general inventive concept, the physiological characteristics of the human perception of sound are taken into consideration. Experimental results related to the present general inventive concept demonstrate that a physically perfect reconstruction of high-frequency components of an audio signal on a noise spectrum (i.e., a reconstruction of original audio signals) is not required by a standard of the human perception of sound.

A sound frequency level is inversely proportional to a precision of frequency reconstruction. That is, the higher the frequency of perceptible sound, the lower the precision of frequency reconstruction. Therefore, in the transmission of sound, it is sufficient to reconstruct only energetic components of sound. In most cases, it is sufficient to obtain correction signals having almost the same energy level as high-frequency components most adequate to represent original audio signals. The energy levels of audio signals close to one another on a frequency spectrum are interrelated. Therefore, in order to efficiently recover audio signals having almost as high a sound quality as corresponding original audio signals, high-frequency components of the audio signals are generated based on low-frequency components of the audio signals. That is, the low-frequency components that are still remaining on the frequency spectrum of the audio signals may be used to recreate the high-frequency components by inverting the frequency spectrum of the audio signals in a temporal domain.

The audio signals may be represented by one or more input digital signals. The inversion of the frequency spectrum of the input digital signal is performed by altering signs (i.e. plus (+) and minus (−) of a plurality of portions of the digital signal, which may be sampled, for example, every second.

The input digital signal with an inverted frequency spectrum is filtered, thereby preventing an original signal and a correction signal from being mixed together. Thereafter, the result of the filtering is shifted, thereby keeping main components on the frequency spectrum of the input digital signal intact.

Figure 1B:
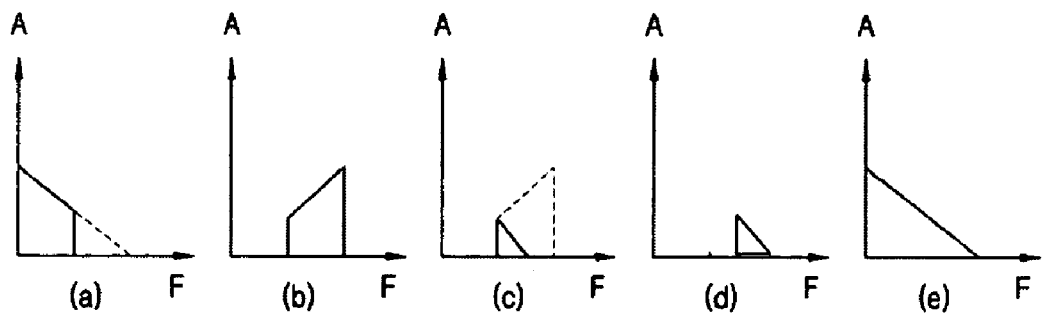
FIG. 1B is a diagram illustrating the frequency spectra of signals corresponding to the block diagram of FIG. 1A.
Figure 2:
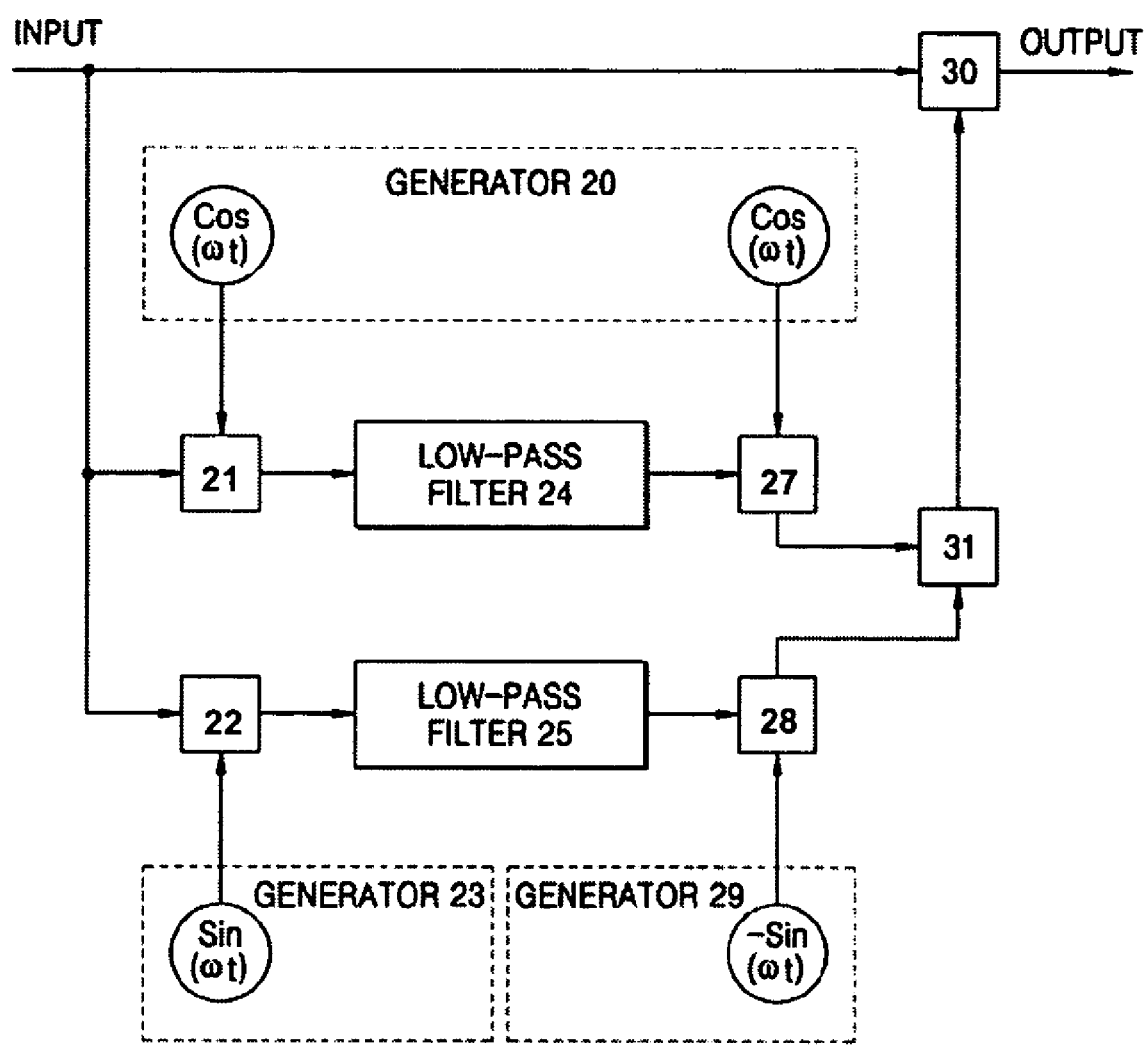
FIG. 2 is a block diagram of a reconstruction heterodyne filter according to an embodiment of the present general inventive concept.

Reconstructing high-frequency components lost from an audio signal according to an embodiment of the present general inventive concept will now be described in detail with reference to FIGS. 1A-1B. FIG. 1A is a block diagram of an apparatus to reconstruct high-frequency components lost from an audio signal, and FIG. 1B illustrates the frequency spectra of signals (a)-(e) of FIG. 1A. FIG. 2 illustrates a block diagram of a reconstruction heterodyne filter used to perform frequency inversion and filtering according to an embodiment of the present general inventive concept.

Specifically, FIG. 1A illustrates the inversion of the frequency spectrum of an audio signal for reconstructing high-frequency components lost from the audio signal according to an exemplary embodiment of the present general inventive concept. Referring to FIG. 1A, an input signal (a) is input to a frequency inverter 1 which alters the signs of portions of the input signal, which may be sampled, for example, every second. The graph (a) of FIG. 1B illustrates the frequency spectrum of an input discrete audio signal. In the graph (a) of FIG. 1B, the A-axis represents the magnitude of the input discrete audio signal, the F-axis represents the frequency of the input discrete audio signal, and a dotted line represents high-frequency components lost from the input discrete audio signal that need to be reconstructed.

The frequency spectrum of a signal (b) output from the frequency inverter 1 illustrated in FIG. 1A is illustrated in the graph (b) of FIG. 1B. The output signal (a) of the frequency inverter 1 is used to generate a correction signal. In general, the higher the frequency of an audio signal, the lower the energy of the audio signal. This principle, however, does not apply to signals having an inverted frequency spectrum, and thus these signals need to be corrected. In other words, high-frequency components of the audio signal are removed, thereby making the frequency spectrum of the audio signal appear natural. A band pass filter 2 may be used to remove high-frequency components of the audio signal. The band pass filter 2 may have a variable bandwidth, so that it can effectively remove acute high-frequency components of an audio signal even after the inversion of the frequency spectrum of the audio signal.

The frequency spectrum of a signal (c) output from the band pass filter 2 is illustrated in the graph (c) of FIG. 1B. In graph (c), dotted lines indicate components filtered out of the input signal by the band pass filter 2. The frequency spectrum of the output signal of the band pass filter 2 is shifted by a converter 3 in order to prevent aliasing from occurring when a correction signal output from the converter 3 is combined with the original audio signal during reconstruction at a reconstruction block 4. A signal output from the converter whose frequency spectrum has been shifted is illustrated in graph (d) of FIG. 1B. The signal (d) output from the converter 3 is a correction signal, and the correction signal is added to the input signal, thereby reconstructing an original signal. The frequency spectrum of the result of the reconstruction is illustrated in the graph (e) of FIG. 1B.

Assuming that the frequency band of the input signal at any arbitrary time is known and information regarding the frequency band of the input signal is directly received by a decoder (not shown) which decodes the input signal, the inverter 1 and the band pass filter 2 of FIG. 1A may be embodied as a single apparatus illustrated in FIG. 2. FIG. 2 is a block diagram of a reconstruction heterodyne filter used to perform frequency inversion and filtering. Referring to FIG. 2, it is possible to design the reconstruction heterodyne filter to perform two different operations, i.e., frequency inversion and filtering operations, because a typical heterodyne filter can simulate an input signal using a complex signal and the inversion of the frequency spectrum of the input signal can be estimated based on the simulation results. Therefore, the reconstruction heterodyne filter can represent input signals as complex signals, and thus the frequency spectra of complex signals can be observed. The frequency spectrum of the input signal is illustrated in graph (a) of FIG. 1B. For convenience of explanation, only one half of the frequency spectrum of the input signal is taken into consideration because the frequency spectrum of the input signal is symmetrical. The input signal is input to multipliers 21 and 22 and is then multiplied by a cosine wave signal $\cos(\omega t)$ obtained by a generator 20 and a sine wave signal $\sin(\omega t)$ obtained by a generator 23, respectively, where t indicates time and $\omega=2\times f$ (where f is a cut-off frequency of the input signal that varies in time (t)). At this time, a phase of the input signal can be obtained by multiplying a complex exponent by a real number component of the input signal. The complex exponent $e^{j\omega t}$ can be obtained using the Euler equation, as indicated in Equation (1):

$$e^{j\omega t}=\cos(\omega t)+j\cdot\sin(\omega t) \quad (1)$$

where j is an imaginary component of the input signal.

The real number component and the imaginary number component of the input signal are input to low-pass filters 24 and 25, respectively. The low-pass filters 24 and 25 may be identical to each other. A multiplier 27 multiplies the real number component of the input signal by a cosine wave signal $\cos(\omega t)$ obtained by the generator 20. A multiplier 28 multiplies the imaginary number component of the input signal by the sine wave signal $-\sin(\omega t)$ obtained by a generator 29, thus eliminating imaginary number information. The multiplication results are output by the multipliers 27 and 28 to an adder 31 that adds the multiplication results of multipliers 27 and 28 to obtain a complex signal. The multipliers 27 and 28 and the adder 31 together realize a multiplication algorithm of the complex exponent $e^{j\omega t}$ and the real component of the input signal as indicated in Equation (2):

$$Re[(x+j\cdot y)\cdot e^{j\omega t}]=Re[(x+j\cdot y)\cdot(\cos(\omega t)+j\cdot\sin(\omega t))]=x\cdot\cos(\omega t)-y\cdot\sin(\omega t) \quad (2)$$

where the complex signal of Equation 2 obtained by the adder 31 is then added to the original input signal by an adder 30.

The reconstruction heterodyne filter to reconstruct high-frequency components of an audio signal includes the adder 30 which serves as a final output port of the reconstruction heterodyne filter.

The adders 30 and 31, the multipliers 21, 22, 27 and 28, the generators 20, 23 and 29 and the low-pass filters 24 and 25 share the following relationships. A first input port of the adder 30 is connected to a signal source from which an original signal that needs to be adjusted is input, i.e., an input port of a predetermined system, and a second input port of the adder 30 is connected to an output port of the adder 31. A first input port of the adder 31 is connected to an output port of the multiplier 27, and a second input port of the adder 31 is connected to an output port of the multiplier 28. A first input port of the multiplier 27 is connected to an output port of the low-pass filter 24, and a first input port of the multiplier 28 is connected to an output port of the low-pass filter 25. An input port of the low-pass filter 24 is connected to an output port of the multiplier 21, and an input port of the low-pass filter 25 is connected to an output port of the multiplier 22. Here, first input ports of the multipliers 21 and 22 are connected to the input port of the predetermined system. Second input ports of the multipliers 21 and 27 are connected to an output port of the generator 20. A second input port of the multiplier 22 is connected to an output port of the generator 23, and a second input port of the multiplier 28 is connected to an output port of a generator 29.

The embodiments of the present general inventive concept can be embodied as computer readable codes on a computer readable recording medium. The computer readable recording medium may include any data storage device that can store data which can be thereafter read by a computer system. Examples of the computer readable recording medium include a read-only memory (ROM), a random-access memory (RAM), CD-ROMs, magnetic tapes, floppy disks, and optical data storage devices. The computer readable recording medium can also be distributed over network coupled computer systems so that the computer readable code is stored and executed in a distributed fashion. The embodiments of the present general inventive concept may also be embodied in hardware or a combination of hardware and software.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of reconstructing high-frequency components of an audio signal comprising:
   generating a high-frequency signal by transforming low-frequency components of an input audio signal into frequency components having a higher frequency; and
   reconstructing high-frequency components of the input audio signal by adding the high-frequency signal to the input audio signal,
   wherein the high-frequency signal is generated by inverting, filtering, and shifting the frequency of the input audio signal.

2. The method of claim 1, wherein the inversion and shifting of the frequency of the input audio signal comprises:
   multiplying a sine wave signal and a cosine wave signal by the input audio signal, the sine wave signal and the cosine wave signal each being generated to have the same frequency as a cut-off frequency of the input audio signal.

3. An apparatus to reconstruct high-frequency components of an audio signal comprising:
   an adder which serves as an output port of the apparatus, wherein,
   a first input port of the adder is connected to an input port of the apparatus through which an input audio signal is received, a second input port of the adder is connected to an output port of a second adder, a first input port of the second adder is connected to an output port of a first multiplier, a second input port of the second adder is connected to an output port of a second multiplier,
   a first input port of the first multiplier is connected to an output port of a first low-pass filter, a second input port of the first multiplier is connected to an output port of a cosine wave signal generator which generates a cosine wave signal $\cos(\omega t)$,
   a first input port of the second multiplier is connected to an output port of a second low-pass filter, a second input port of the second multiplier is connected to an output port of a sine wave signal generator which generates a sine wave signal $-\sin(\omega t)$ with a reversed sign,
   an input port of the first low-pass filter is connected to an output port of a third multiplier,
   an input port of the second low-pass filter is connected to an output port of a fourth multiplier,
   first input ports of the third and fourth multipliers are connected to the input port of the apparatus,
   a second input port of the third multiplier is connected to an output port of the cosine wave signal generator,
   a second input port of the fourth multiplier is connected to an output port of a second sine wave signal generator which generates a sine wave signal $\sin(\omega t)$.

4. A computer readable medium containing executable code to perform a method of reconstructing high-frequency components of an audio signal, the method comprising:
   transforming low-frequency components of an input audio signal to frequency components having a higher frequency to obtain a high-frequency signal, and reconstructing high-frequency components of the input audio signal by adding the high-frequency signal to the input audio signal,
   wherein the high-frequency signal is generated by inverting, filtering, and shifting the frequency of the input audio signal.

5. A method of reconstructing high-frequency components of an audio signal comprising:
   inverting a frequency spectrum of an input audio signal to generate an inverted signal having higher frequency components than the input audio signal;
   filtering the inverted signal to remove a higher frequency portion of the inverted signal having a higher frequency spectrum than the remaining portion of the inverted signal to generate a filtered signal;
   shifting a frequency spectrum of the filtered signal to generate a correction signal; and
   adding the correction signal to the input audio signal to obtain a reconstructed audio signal.

6. The method of claim 5, wherein the inverting and filtering operations are performed by a reconstruction heterodyne filter.

7. An apparatus to reconstruct high-frequency components of an audio signal comprising:
   an inverter to invert a frequency spectrum of an input audio signal, and to generate an inverted signal having higher frequency components than the input audio signal;
   a filter to filter the inverted signal to remove a higher frequency portion of the inverted signal having a higher frequency spectrum than the remaining portion of the inverted signal, and to generate a filtered signal;
   a converter to shift a frequency spectrum of the filtered signal to generate a correction signal; and
   an adder to add the correction signal to the input audio signal to obtain a reconstructed audio signal.

8. The apparatus of claim 7, wherein the inverter and the filter are components of a reconstruction heterodyne filter.

9. A computer readable medium containing executable code to perform a method of reconstructing high-frequency components of an audio signal, the method comprising:
   inverting a frequency spectrum of an input audio signal, and generating an inverted signal having higher frequency components than the input audio signal;
   filtering the inverted signal to remove a higher frequency portion of the inverted signal having a higher frequency spectrum than the remaining portion of the inverted signal, and to generate a filtered signal;
   shifting a frequency spectrum of the filtered signal to generate a correction signal; and adding the correction signal to the input audio signal to obtain a reconstructed audio signal.

10. An apparatus to reconstruct high-frequency components of an audio signal comprising:

first through fourth multipliers, the first multiplier to multiply an input signal by a first function to generate a first multiplied signal and the second multiplier to multiply the input signal by a second function different from the first function to generate a second multiplied signal;

first and second filters to receive the first and second multiplied signals, respectively, each of which removes at least one frequency component from frequency spectrums of the first and second multiplied signals and outputs first and second filtered signals to the third and fourth multipliers such that the third multiplier multiplies the first filtered signal by the first function to generate a third multiplied signal and the fourth multiplier multiplies the second filtered signal by a third function different from the first and second functions to generate a fourth multiplied signal; and first and second adders, the first adder to add the third and fourth multiplied functions to obtain a correction signal and to output the correction signal to the second adder which adds the correction signal to the input signal to obtain a reconstructed signal.

11. The apparatus of claim 10, further comprising:
first through third generators that generate the first through the third functions, respectively.

12. The apparatus of claim 11, wherein the third generator generates a function that is a negative of the second function.

13. The apparatus of claim 10, wherein the first and second filters are the same type of filter.

14. The apparatus of claim 13, wherein the frequency components of the frequency spectrums of the first and second multiplied signals removed by the first and second filters are low frequency components.

15. A method to reconstruct high-frequency components of an audio signal comprising:

multiplying an input signal by a first function to generate a first multiplied signal and multiplying the input signal by a second function different from the first function to generate a second multiplied signal;

filtering at least one frequency component from frequency spectrums of the first and second multiplied signals and outputting first and second filtered signals;

multiplying the first filtered signal by the first function to generate a third multiplied signal and multiplying the second filtered signal by a third function different from the first and second functions to generate a fourth multiplied signal; and adding the third and fourth multiplied functions to obtain a correction signal and adding the correction signal to the input signal to obtain a reconstructed signal.

* * * * *